United States Patent [19]

Reiner et al.

[11] Patent Number: 5,151,904
[45] Date of Patent: Sep. 29, 1992

[54] RECONFIGURABLE, MULTI-USER VITERBI DECODER

[75] Inventors: Thomas C. Reiner, Carlsbad; Mark J. Lindsey; Krishnanand Kelkar, both of San Diego, all of Calif.

[73] Assignee: The Titan Corporation, San Diego, Calif.

[21] Appl. No.: 590,238

[22] Filed: Sep. 27, 1990

[51] Int. Cl.⁵ .............................................. G06F 11/10
[52] U.S. Cl. ......................................... 371/43; 371/41
[58] Field of Search ....................... 371/41, 43, 44, 45, 371/46

[56] References Cited

U.S. PATENT DOCUMENTS

| | | | |
|---|---|---|---|
| 3,078,443 | 2/1963 | Rose | 371/41 |
| 4,583,236 | 4/1986 | Kromer | 371/43 |
| 4,701,923 | 10/1987 | Fukashawa | 371/41 |
| 4,805,174 | 2/1989 | Kubota | 371/43 |

FOREIGN PATENT DOCUMENTS 544152 4/1977 U.S.S.R. .................... 371/41

OTHER PUBLICATIONS

Viterbi, "Error Bounds for Convolutional Codes and an Asymptotically Optimum Recording Algorithm", IEEE Transactions on Information Theory, vol. IT-13, No. 2, Apr. 1967, pp. 260-269.

Odenwalder, "Error Control", Data Communications, Networks and Systems, Bartee, Ed. Sams 1985, Ch. 10, pp. 289-354.

Yasuda et al., "Development of Variable-Rate Viterbi Decoder and Its Performance Characteristics", Sixth International Conference on Digital Satellite Communications, Sep. 19-23, 1983, pp. XII-24 to XII-31.

Primary Examiner—Robert W. Beausoliel
Attorney, Agent, or Firm—Edward W. Callan

[57] ABSTRACT

A decoding system for decoding a digital data stream that has been convolutionally encoded in accordance with a selected constraint length and selected polynomial codes, which system includes a processor, such as a Viterbi decoder, that is reconfigurable so that it can decode encoded digital data streams for a number of different user channels for which data streams have been convolutionally encoded in accordance with respectively different combinations of selected constraint length and selected polynomial codes. The decoding system includes a Viterbi decoder for processing the encoded data stream in accordance with said selected constraint length and in accordance with said selected polynomial codes to decode the encoded data stream; a RAM for storing data of said selected constraint length and data of said selected polynomial codes in accordance with which said data stream was encoded; and a RAM I/O interface circuit responsive to a user channel identification signal for retrieving said selected constraint length data and said selected polynomial code data from the RAM and configuring the Viterbi decoder in accordance with said selected constraint length and said selected polynomial codes. In order to accommodate concurrent multiple user channels, the RAM stores different sets of combinations of constraint length data and polynomial code data corresponding to different user channels, with said different sets being retrievable from the RAM in response to respectively different user channel identification signals. The polynomial code data and constraint length data in the RAM may be changed from time to time in response to software instructions, as user channel requirements change. The Viterbi decoder processes said encoded data stream over a plurality of decoding cycles and produces intermediate decoding results during different decoding cycles; and the RAM I/O interface circuit stores in the RAM said intermediate decoding results produced for each different user channel during the different decoding cycles.

12 Claims, 2 Drawing Sheets

RECONFIGURABLE, MULTI-USER VITERBI DECODER

BACKGROUND OF THE INVENTION

The present invention generally pertains to digital signal processing and is particularly directed to an improvement in decoding systems that are used to decode convolutionally encoded digital data streams.

Digital data streams are convolutionally encoded to enhance forward error correction, as described in a paper entitled "Error Control" by Joseph P. Odenwalder, published in "Data Communications, Networks, and Systems", Thomas C. Bartee, Ed. (Indianapolis: Howard W. Sams, 1985) at Chapter 10, pages 289–354.

An example of a convolutional encoder is shown in FIG. 1. A digital data stream is convolutionally encoded by shifting the data stream 10 through a shift register 12 having a given number of stages, with bits of the data stream from given stages of the shift register being tapped and provided to a number of exclusive-OR (XOR) gates 14, 16 from which an encoded digital data stream is provided as a combination of I and J components. A convolutional encoder may include a greater number of XOR gates and/or a greater number of shift registers than in the example shown in FIG. 1. The given number of stages of the shift register 12 is commonly referred to as the "constraint length". Polynomial binary codes determine the particular stages of the shift register from which bits of the registered data stream are provided to a given XOR gate 14, 16. These polynomial codes are sometimes referred to as "code taps". In the example of FIG. 1, the constraint length is seven, the polynomial code for the XOR gate 14 is 1111001 and the polynomial code for the XOR gate 16 is 1011011.

A convolutionally encoded data stream is decoded by a data processor that processes the encoded data stream in accordance with the given constraint length and in accordance with the selected polynomial codes. Preferably the convolutionally encoded data stream is decoded in accordance with an algorithm described in a paper entitled "Error Bounds for Convolutional Codes and an Asymptotically Optimum Decoding Algorithm" by Andrew J. Viterbi, published in "IEEE Transactions on Information Theory", Vol IT-13, no. 2, Apr. 1967, at pages 260-269. Decoders that use the Viterbi decoding algorithm are known as Viterbi decoders.

A Viterbi decoder is a path maximum likelihood decoder which provides forward error correction by employing a convolutional decoding scheme that typically provides four to five dBs of coding gain at a $10^{-5}$ bit error rate compared to unencoded systems. Thus, less power is required in the system to obtain an equivalent bit error rate. The Viterbi decoder works in conjunction with an interleaver which spreads each bit of baseband data over many bit times. The correlation of the received data symbol stream allows the decoder to choose the most probable state of the encoder even though the communications channel is corrupted by noise.

The use of Viterbi decoders for decoding data that has been convolutionally encoded in accordance with different fractional-rate codes and modulated for transmission by different modulation techniques is also described in the aforementioned paper by Odenwalder and in a paper entitled "Development of Variable-Rate Viterbi Decoder and Its Performance Characteristics" by Yukata Yasuda, Yasuo Hirata, Katsuhiro Nakamura and Susumu Otani, published in Sixth International Conference on Digital Satellite communication, Sep. 19-23, 1983" at pages XII-24 to XII-31.

SUMMARY OF THE INVENTION

The present invention provides a decoding system for decoding a digital data stream that has been convolutionally encoded in accordance with a selected constraint length and selected polynomial codes, which system includes a processor, such as a Viterbi decoder, that is reconfigurable so that it can decode multiple encoded digital data streams for a number of different user channels for which data streams have been convolutionally encoded in accordance with respectively different combinations of selected constraint length and selected polynomial codes.

The decoding system of the present invention includes means for processing the encoded data stream in accordance with said selected constraint length and in accordance with said selected polynomial codes to decode the encoded data stream; a memory for storing data of said selected constraint length and data of said selected polynomial codes in accordance with which said data stream was encoded; and means responsive to a user channel identification signal for retrieving said selected constraint length data and said selected polynomial code data from said memory and configuring said processing means in accordance with said selected constraint length and said selected polynomial codes.

In order to accommodate concurrent multiple user channels, the memory stores different sets of combinations of constraint length data and polynomial code data corresponding to different user channels, with said different sets being retrievable from the memory in response to respectively different user channel identification signals.

In one preferred embodiment of the decoding system, wherein the processor is configured to decode at a given code rate an encoded data stream that was encoded at the given code rate, the memory stores two different sets of polynomial codes for a given user channel; the processing means is capable of operating in a punctured processing mode to decode the data stream at the given code rate in accordance with the two different sets of polynomial codes alternately to decode an encoded data stream that was encoded at a higher rate than the given rate; and the retrieving means alternately select the two different polynomial codes alternately during each cycle of said punctured processing mode in response to a punctured processing mode instruction accompanying said user channel identification signal and thereby configures the processing means to process the data stream at the given code rate in accordance with the two different sets of polynomial codes alternately for decoding an encoded data stream that was encoded at the higher rate.

Additional features of the present invention are described in relation to the description of the preferred embodiment.

DESCRIPTION OF THE PREFERRED EMBODIMENT

The preferred embodiment of the decoding system of the present invention is designed for use as a peripheral to a host data processing system, such as a microprocessor.

Figure 2:
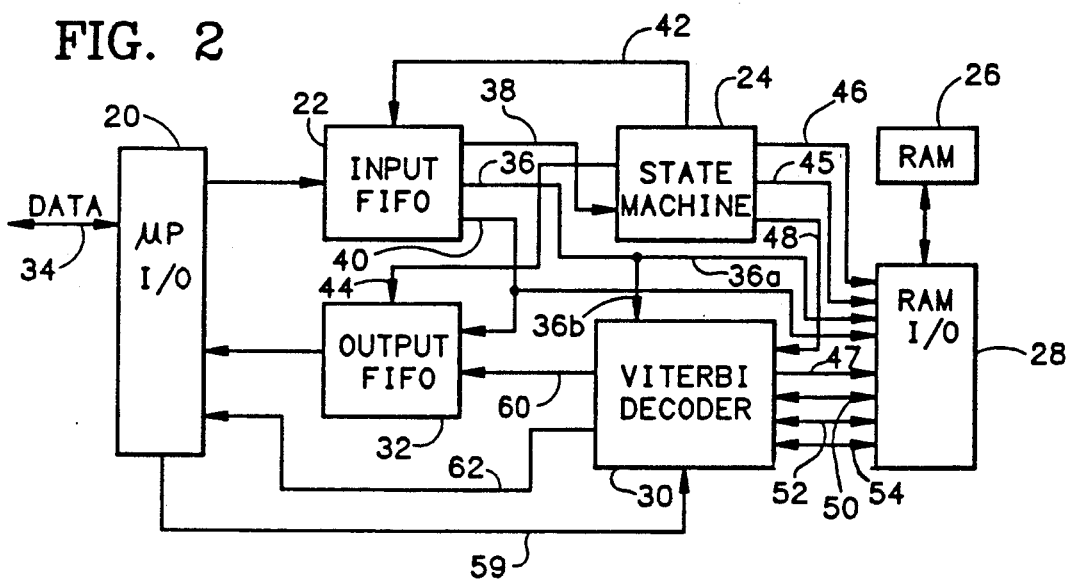
FIG. 2 is a block diagram of the decoding system of the present invention.

Referring to FIG. 2, one such preferred embodiment includes a microprocessor ($\mu$P) I/O interface circuit 20, an input first-in-first-out (FIFO) buffer 22, a state machine 24, a random access memory (RAM) 26, a RAM I/O interface circuit 28, a Viterbi decoder 30 and an output FIFO buffer 32. These components other than the RAM 26 are embodied in a single integrated circuit chip.

The microprocessor I/O interface circuit 20 is coupled by a data bus 34 to a host microprocessor (not shown) that processes the decoded data stream. The microprocessor I/O interface circuit 20 provides an asynchronous interface between the decoding system of FIG. 2 and the host processor. Initialization data and the convolutionally encoded data stream that is to be decoded by the Viterbi decoder are provided over the data bus 34 from the host processor to the microprocessor I/O interface circuit 20 together with user channel identification data and instructions pertaining to each byte of the encoded data stream.

Clock signals for the components of the decoding system of FIG. 2 are separately provided from the host processor via the microprocessor I/O interface circuit 20.

The initialization data, the convolutionally encoded data, the instructions and the user channel identification data are latched into the input buffer 22 from the microprocessor I/O interface circuit 20.

Figure 1:
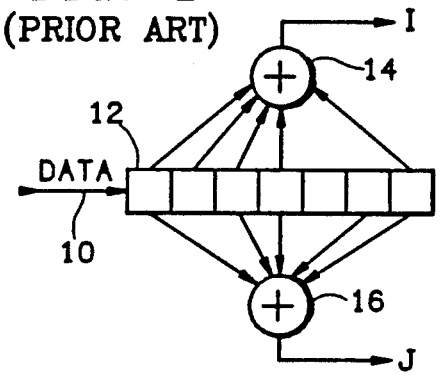
FIG. 1 is a diagram of a prior art convolutional encoder.
Figure 3:
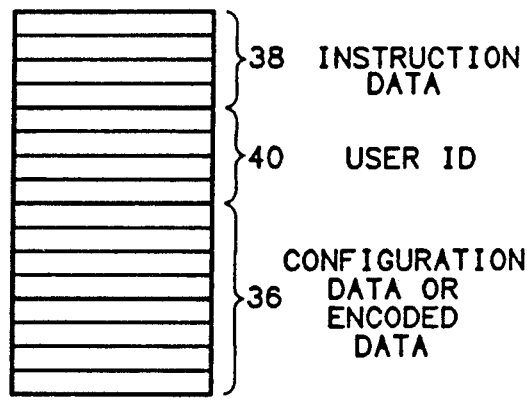
FIG. 3 illustrates the composition of the data provided from the input FIFO buffer of the decoding system of FIG. 2.

The state machine 24 causes eight bits 36 of either initialization data 36a or encoded data 36b to be read from the input FIFO buffer 22 in combination with a four-bit instruction 38 to the state machine 24 and a four-bit user channel identification (ID) signal 40 to the RAM I/O interface circuit 28 and the output FIFO buffer 32. The instruction 38 and the user channel ID signal 40 are provided for each eight bits of data 36 read from the input FIFO buffer 22, as shown in FIG. 3. In accordance with the four-bit user channel ID signal 40, the decoder system of FIG. 2 can accommodate up to sixteen different user channels.

Adjacent instructions in the queue of the input FIFO buffer 22 are fully independent from one another so that each instruction can execute a decoding cycle for a different user channel.

The state machine 24 provides READ signals 42 to the input FIFO buffer 22, WRITE signals 44 to the output FIFO buffer 32, control signals 45 and READ/WRITE signals 46 to the RAM I/O interface circuit 28 and control and timing signals 48 to the Viterbi decoder 30.

The RAM I/O interface circuit 28 generates an address to a given section of the RAM 26 in response to the control signals 45 from the state machine 24, a control signal 47 from the Viterbi decoder 24 and the user channel ID signal 40; and causes data to be either read from or written into the addressed section of the RAM 26 in response to the READ/WRITE signals 46 from the state machine 24. The RAM 26 stores a separate page of data for each of the different user channels.

During an initialization mode of operation, as determined by the instructions 38, the state machine 24 provides control signals 45 that causes the RAM I/O interface circuit 28 to write (store) initialization data 36a into a section of the RAM 26 reserved for the user channel identified by the particular user channel ID signal 40 that accompanies the initialization data 36a. This initialization data includes configuration data and initial state metrics, which are stored in the RAM 26 for each user channel. The configuration data includes the constraint length K, the polynomial codes P, branch assignments, a differential decoding bit, an automatic synchronization bit and a J-component sign-reversal bit. In the preferred embodiment, two different sets of polynomial codes $P_{AI} P_{AJ}$ and $P_{BI} P_{BJ}$ are stored in the RAM 26 for each user channel.

During a decoding mode of operation, as determined by the instructions 38, the state machine 24 provides a control signal 45 and a READ signal 46 that cause the RAM I/O interface circuit 28 to retrieve from the RAM 26 unique channel data stored therein pertaining to the user channel channel identified by the user channel ID signal 40 accompanying said instructions 38; and the state machine 24 further provides timing and control signals 48 that cause the Viterbi decoder 30 to be configured and initialized for each decoding cycle in accordance with the retrieved unique channel data for the identified user channel and then decode eight bits of 4-bit I and J symbol pairs 36b from the encoded data stream that accompany said instructions 38. Each four bits is referred to as a nibble.

The microprocessor passes I and J symbol pairs in byte format to the input FIFO buffer 22 with the first nibble providing the I symbol and the second nibble providing the J symbol. Each 4-bit I or J data symbol in the data stream includes three soft decisions bits. Three soft decision bits provide eight quantization levels, thereby allowing an associated demodulator to measure the received symbol energy and assign a metric to the symbol decision. Since each 4-bit data symbol in the data stream includes three soft decisions bits and an erasure bit, eight quantization levels are provided, thereby allowing an associated demodulator to measure the received symbol energy and assign a metric to the symbol decision. Soft decisions provide an extra two dBs of coding gain by allowing the decoder to use the demodulator's quantization of the received symbol energy that can be used by the decoder in determining the maximum likelihood path.

A separate page of the RAM 26 is used for storing intermediate results for each of the sixteen decoder channels.

Figure 4:
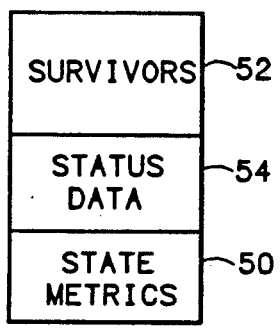
FIG. 4 illustrates the composition of data stored for each user channel in the RAM of the decoding system of FIG. 2.

Referring to FIG. 4, the unique channel data that is stored on a separate page of the RAM 26 for each different user channel includes state metrics 50, survivors 52 and status data 54. The state metrics are referred to in the paper by Odenwalder as "path metrics". The size of a RAM page is determined by largest constraint length of the sixteen channels. An all $K=7$ system requires 1 Kilobyte per user channel. If the largest constraint length is $K=8$, then 2 Kilobytes are required per user channel. A $K=9$ system requires 4K bytes per user channel. Page size is determined by initializing an internal configuration register via the microprocessor I/O interface circuit 20. $K=7$ and $K=8$ systems can coexist with a $K=9$ system in a 4-Kilobyte page size environment. A $K=7$ system channel can coexist with a $K=8$ system in a 2-Kilobyte page size environment.

Figure 5:
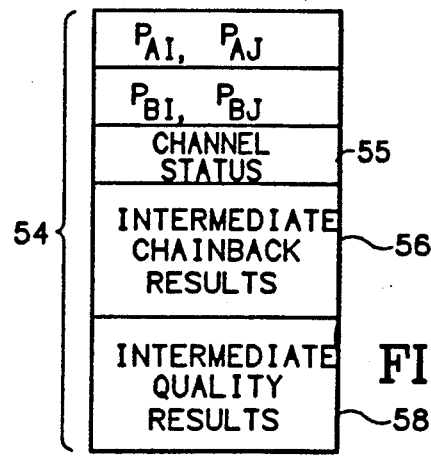
FIG. 5 illustrates the composition of the status data portion of the stored user channel data illustrated in FIG. 4.

Referring to FIG. 5, the status data 54 includes the two sets of polynomial codes $P_{AI} P_{AJ}$ and $P_{BI} P_{BJ}$ channel status data 55, intermediate results 56 of a chainback operation and intermediate results 58 of a quality operation both of which are performed by the Viterbi decoder 30. Each set of the polynomial codes includes a polynomial code pertaining to the I component and a polynomial code pertaining to the J component. One or the other of the two sets of polynomial codes $P_{AI} P_{AJ}$ or $P_{BI} P_{BJ}$ is selected by the RAM I/O interface circuit 28 for retrieval from the RAM 26 in response to a combination of the user channel ID signal 40 and the control signal 45 produced by the state machine 24 in response to the instruction 38 accompanying said user channel ID signal 40.

By storing two different sets of polynomial codes for each user channel a Viterbi decoder 30 configured to decode a data stream that is encoded at a given code rate can be reconfigured to decode a data stream that is encoded at a higher code rate by operating in a punctured processing mode to decode the data stream at the given code rate in accordance with the two different sets of polynomial codes alternately. Such reconfiguration is accomplished with minimal interaction with the microprocessor to which the decoding system is coupled by the microprocessor I/O interface circuit 20.

The RAM interface circuit 28 alternately selects the two different polynomial codes alternately during each cycle of the punctured processing mode in response to a punctured processing mode instruction 38 accompanying the user channel ID signal 40 and thereby configures the Viterbi decoder 30 to process the data stream at the given code rate in accordance with the two different sets of polynomial codes alternately for decoding an encoded data stream that was encoded at the higher rate.

Figure 6A:
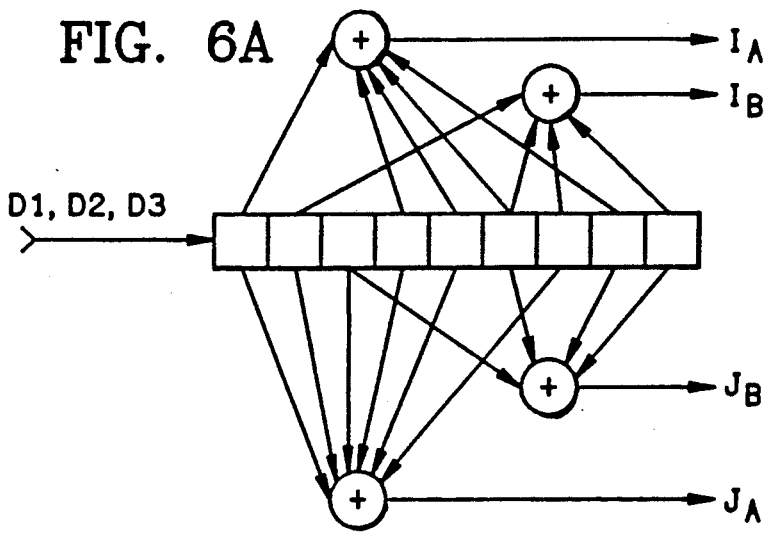
FIG. 6A is a diagram of a K=9, encoding rate=$\frac{3}{4}$ convolutional encoder.
Figure 6B:
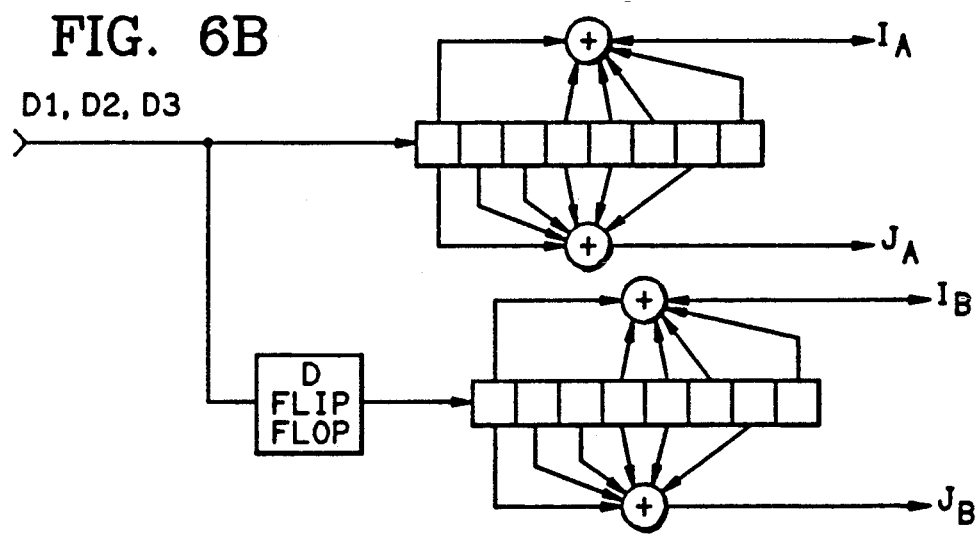
FIG. 6B is a diagram of a combination of two K=8, encoding rate=$\frac{1}{2}$ encoders that is equivalent to the K=9, encoding rate=$\frac{3}{4}$ convolutional encoder of FIG. 6A.

For example, a convolutional encoder that encodes a data stream in accordance with a constraint length of $K=9$ and a rate $\frac{3}{4}$ code, as shown in FIG. 6A, is equivalent to a combination of two convolutional encoders that encode a data stream in accordance with a constraint length of $K=8$ and a rate $\frac{1}{2}$ code, as shown in FIG. 6B. By operating in the punctured processing mode a Viterbi decoder 30 adapted for decoding data in accordance with a rate $\frac{1}{2}$ code and configured in accordance with a constraint length $K=8$ during each decoding cycle alternately processes two data symbols $I_A$ and $J_A$ in accordance with the first set of polynomial codes $P_{AI}$ and $P_{AJ}$ and two data symbols $I_B$ and $J_B$ in accordance with the second set of polynomial codes $P_{BI}$ and $P_{BJ}$ to thereby decode a data stream that was encoded in accordance with a constraint length of $K=9$ and a rate $\frac{3}{4}$ code.

Figure 7:
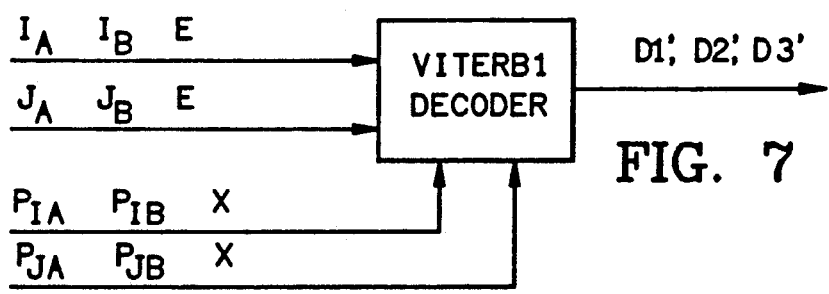
FIG. 7 is a diagram illustrating the input data symbols and input polynomial codes provided to the Viterbi decoder in one preferred embodiment of the decoding system of FIG. 2 and the output data therefrom when operated in a punctured processing mode to decode an encoded data stream encoded in accordance with a constraint length of K=9 and an encoding rate of $\frac{3}{4}$.

Referring to FIG. 7, in the preferred embodiment for implementing this example in the puncture processing mode, the Viterbi decoder 30 alternately processes data symbols $I_A$ and $J_A$ together with the corresponding set of polynomial codes $P_{AI}$ and $P_{AJ}$ during one decoding cycle and data symbols $I_B$ and $J_B$ together with the corresponding set of polynomial codes $P_{BI}$ and $P_{BJ}$ during an adjacent decoding cycle; and during every third decoding cycle the Viterbi decoder 30 operates in an erasure stage E during which the state metrics are not updated. During the erasure stage, the Viterbi decoder 30 is configured in accordance with an arbitrary set of polynomial codes X, which are not used in the decoding process. Three output data bits D1' D2' and D3' are provided from the Viterbi decoder 30 for the every three decoding cycles, during which the four input data symbols $I_A J_A I_A$ and $J_A$ are processed. In order to configure the Viterbi decoder for operation in this punctured processing mode, the microprocessor must set an erasure bit in a configuration register within the microprocessor I/O interface circuit 20 to ONE and the erasure bit in each input data symbol also must be set to ONE. The state of the erasure bit in the configuration register of the microprocessor I/O interface circuit 20 is communicated to the Viterbi decoder 30 via line 59.

Figure 8:
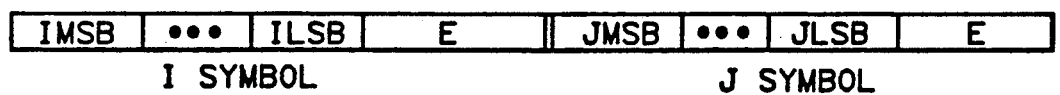
FIG. 8 illustrates the format of the encoded data symbols provided to the Viterbi decoder in preferred embodiment of the decoding system of FIG. 2.

The format for the input data symbols is illustrated in FIG. 8. The I data symbol includes three soft decision bits IMSB, . . . , ILSB and an erasure bit E; and the J data symbol includes three soft decision bits JMSB, . . . , JLSB and an erasure bit E.

The channel status data 55 for each user channel includes the constraint length K and other configuration data, including branch assignments, the differential decoding bit, the automatic synchronization bit and the J-component signreversal bit.

The branch assignments further define the polynomial codes by indicating how the first and last bits within the registered constraint length of bits are to be processed.

Decoded data 60 from the Viterbi decoder 30 is latched into the output FIFO buffer 32 in response to a WRITE signal 44 from the state machine 24. The output FIFO buffer 32 stores the results of up to 32 bytes of decoded data plus the user channel identification code associated with each byte.

The Viterbi decoder 30 includes a trellis generator and a trellis chainback unit. The trellis generator consists of a branch metric generator and a pipelined add-compare-select (ACS) unit. The RAM 26 is accessed by the Viterbi decoder 30 during every clock cycle. State metrics are four bits wide and are packed into bytes for external storage. Four butterflies on the trellis are calculated during every ten clock cycles. Four clock cycles are used to read in old state metrics followed by four clock cycles to store new state metrics. The ninth clock cycle is used to store the eight survivors of the four butterflies. Finally, a trellis chainback operation is executed during the tenth clock cycle.

Trellis chainback is the opposite of trellis generation. The purpose of chainback is to find the path through the trellis that is the most likely path that the encoder took at the transmitter portion of the communication system. The trellis is the stored history of the survivors for all states for a number of decoding cycles. Acceptable chainback length is generally taken to be five times the constraint length K for non-punctured codes. In the preferred embodiment of the decoding system of the present invention the Viterbi decoder has a chainback length of 56 for a constraint length of K=7 and a chainback length of 72 for constraint length of either K=8 or K=9. When the chainback depth has been reached, the Viterbi decoder 30 assumes that is has merged to the correct path and chains back an additional eight trellis levels. These last eight bits are declared to be decoded baseband data and are written to the output FIFO buffer 32 along with its associated user channel ID signal 40. The additional chainback depth is necessary for punctured codes.

Further detail concerning the operation of a Viterbi decoder is described in the aforementioned paper by Odenwalder.

The Viterbi decoder 30 operates in a differential decoding mode when so enabled by a differential decoding enablement bit being retrieved from the RAM 26 in response to the user channel ID signal 40. In this mode the Viterbi decoder 30 differentially decodes a data stream that has been differentially encoded in order to resolve 180 degree phase ambiguities.

The Viterbi decoder 30 operates in an automatic synchronization mode when so enabled by an automatic synchronization enablement bit being retrieved from the RAM 26 in response to the user channel ID signal 40. Automatic channel synchronization is provided independently for each of the sixteen user channels. Channel synchronization is detected by the rate at which normalization occur in the ACS unit. Normalization occurs whenever none of the state metrics is less than four. At that time, a flag is set and all old state metrics have four substracted from them when calculating the new state metrics. Normalizations give an indication that either the channel is correctly synchronized but bursty or that the channel is out of sync. An eight-bit normalization register keeps track of the normalization rate. It is incremented for every decoding cycle in which the normalization flag is set. The normalization register is decremented whenever a programmable timeout counter overflows and the normalization flag is not set. In this way, the quality or the channel is dynamically monitored. The channel is declared to be out of sync whenever the most significant bit (MSB) of the normalization counter (also called the quality bit) is set. This quality bit is communicated to the microprocessor I/O interface circuit 20 via line 62.

A configuration register in the Viterbi decoder 30 selects whether BPSK or QPSK demodulation is being employed. This selection is applicable to all sixteen user channels. The automatic synchronization feature saves microprocessor software overhead of having to perform a nibble swap. Automatic synchronization can be disabled and synchronization calculated by the microprocessor. The quality bit for each user channel is available by reading the output buffer status register in the Viterbi decoder 30.

If the quality bit is set, then an internal crossbar switch in the Viterbi decoder 30 swaps the order from IJ to JI to the branch metric generator of the Viterbi decoder. The remainder of the synchronization function is dependent on the demodulation scheme being BPSK or QPSK. QPSK modulation inverts the sign of the J symbol (was the I symbol) and the correct phase reference is obtained when utilizing transparent codes. An out of sync BPSK stream requires that the previous I symbol be saved and used in conjunction with the new swapped J symbol. BPSK automatic synchronization can only be utilized for the lower four channels as the old symbol is saved internally which requires additional internal storage elements.

The Viterbi decoder 30 operates in a J-sign inversion mode whenever it is configured by the J-component sign-reversal bit. When operating in this mode, the Viterbi decoder reverses the sign of the J component prior to processing the encoded data stream. The Viterbi decoder 30 is so configured when the J-component sign-reversal bit retrieved from the RAM 26 in response to the user channel ID signal 40.

The state machine 24 runs in idle mode whenever the input FIFO buffer 22 is empty. This idle mode forces the RAM I/O interface circuit 28 to an off state in order to conserve system power. When a non-empty condition is detected, the state machine 24 executes the instruction at the head of the queue of the input FIFO buffer 22. The state machine 24 is prohibited from writing to a completely full output FIFO buffer 32. When this condition occurs, the state machine 24 causes the decoding system goes into a waiting mode until the microprocessor to which the decoding system is coupled reads decoded data and the associated user channel ID from the output FIFO buffer 32 via the microprocessor I/O interface circuit 20.

The decoding system of the present invention is inherently simple to use as a microprocessor peripheral and achieves multi-user channel decoder configuration flexibility by utilizing software rather than hardware to configure the Viterbi decoder 30 for each different user channel by accessing from the RAM 26 the unique different user channel configuration data that is stored therein by the microprocessor and may be changed from time to time as the user channel requirements change.

The asynchronous microprocessor I/O interface circuit 20 permits the formatting and throughput to be controlled externally by a microprocessor or microcontroller. Incoming symbol pairs or decoded data can be buffered in the main memory of the microprocessor if desired. The role of the microprocessor is also useful when punctured codes are employed where individual symbol erasures must be set. When generator matrices of higher rates are reducible, the erasure pattern can have a unique format and a microprocessor is an optimal solution for setting erasure bits.

The microprocessor I/O interface circuit 20 uses a chip select, three address bits, and a read strobe as well as a write strobe. The two strobes require only ten nanoseconds of setup and hold time in relationship to the chip select and address.

The input clock signal to the decoding system is at twice the rate of system clock rate of the internal logic core and is used internally to partition the system clock into four quadrants Q1, Q2, Q3 and Q4. The quarter cycles provide a reliable interface to the external RAM 26 with no possibility of bus contention. The first quadrant is always a dead time preventing bus collisions as one driver turns off and the other turns on. This occurs when switching from a read to a write cycle or vice-versa. A write cycle asserts its strobe during Q2 and Q3 providing adequate setup and hold time for address and data. The read cycle strobe is asserted from Q2 through Q4.

The RAM interface 28 provides a sixteen-bit address, eight data bits, a chip select, a RAM output enable, and a RAM write strobe. This interface is entirely transparent to the microprocessor software.

When the interface to the RAM has strict ambiguity group requirements, the microprocessor I/O interface circuit 20 includes an additional input pin, which tristates all control, address, and data to the external RAM 26. This permits isolation of the RAM 26 from the remainder of the decoding system so that direct board level testing can be executed. This additional bit also allows accessibility to every RAM address directly from the microprocessor bus 26 through the remainder of the decoding system.

We claim:

1. A decoding system for decoding a digital data stream that has been convolutionally encoded in accordance with a selected constraint length and selected polynomial codes, comprising
   means for processing said encoded data stream in accordance with said constraint length and in accordance with said selected polynomial codes to decode said encoded data stream;
   a memory for storing data of said selected constraint length and data of said selected polynomial codes in accordance with which said data stream was encoded; and
   means responsive to a user channel identification signal for retrieving said selected constraint length data and said selected polynomial code data from said memory and configuring the processing means in accordance with said selected constraint length and said selected polynomial codes;
   wherein the memory stores different sets of combinations of constraint length data and polynomial code data corresponding to different user channels, with said different sets being retrievable from the memory by the retrieving means in response to different user channel identification signals for respectively configuring the processing means for different user channels.

2. A decoding system according to claim 1, wherein the processing means are adapted for processing said encoded data stream over a plurality of decoding cycles and for producing intermediate decoding results during different decoding cycles;
   the system further comprising
   means coupled to the processing means for storing in the memory said intermediate decoding results produced for each different user channel during the different decoding cycles.

3. A decoding system for decoding a digital data stream that has been convolutionally encoded in accordance with a selected constraint length and selected polynomial codes, comprising
   means for processing said encoded data stream in accordance with said constraint length and in accordance with said selected polynomial codes to decode said encoded data stream;
   a memory for storing data of said selected constraint length and data of said selected polynomial codes in accordance with which said data stream was encoded; and
   means responsive to a user channel identification signal for retrieving said selected constraint length data and said selected polynomial code data from said memory and configuring the processing means in accordance with said selected constraint length and said selected polynomial codes;
   wherein the processor is configured to decode at a given code rate an encoded data stream that was encoded at the given code rate;
   wherein the memory stores two different sets of polynomial codes for a given user channel;
   wherein the processing means is capable of operating in a punctured processing mode to decode the data stream at the given code rate in accordance with the two different sets of polynomial codes alternately to decode an encoded data stream that was encoded at a higher rate than the given rate; and
   wherein the retrieving means alternately select the two different polynomial codes alternately during each cycle of said punctured processing mode in response to a punctured processing mode instruction accompanying said user channel identification signal and thereby configures the processing means to process the data stream at the given code rate in accordance with the two different sets of polynomial codes alternately for decoding an encoded data stream that was encoded at the higher rate.

4. A decoding system for decoding a digital data stream that has been convolutionally encoded in accordance with selected polynomial codes, comprising
   means for processing said encoded data stream in accordance with said selected polynomial codes to decode said encoded data stream;
   a memory for storing data of said selected polynomial codes in accordance with which said data stream was encoded; and
   means responsive to a user channel identification signal for retrieving said selected polynomial code data from said memory and configuring said processing means in accordance with said selected polynomial codes;
   wherein the memory stores different polynomial code data corresponding to different user channels, with said different polynomial code data being retrievable from the memory in response to respectively different user channel identification signals.

5. A decoding system according to claim 4, wherein the memory stores different sets of polynomial codes for each of a plurality of different user channels, with said selected polynomial codes being retrievable from the memory in response to a combination of said user channel identification signal and an instruction accompanying said user channel identification signal.

6. A decoding system according to claim 4, wherein the processing means are adapted for processing said encoded data stream over a plurality of decoding cycles and for producing intermediate decoding results during different decoding cycles;
   the system further comprising
   means coupled to the processing means for storing in the memory said intermediate decoding results produced for each different user channel during the different decoding cycles.

7. A decoding system for decoding a digital data stream that has been convolutionally encoded in accordance with selected polynomial codes, comprising
   means for processing said encoded data stream in accordance with said selected polynomial codes to decode said encoded data stream;

a memory for storing data of said selected polynomial codes in accordance with which said data stream was encoded;

means responsive to a user channel identification signal for retrieving said selected polynomial code data from said memory and configuring said processing means in accordance with said selected polynomial codes;

means for differentially decoding a data stream that has been differentially encoded in order to resolve 180 degree phase ambiguities;

wherein the memory further stores data indicating whether or not the differential decoding means are to be enabled; and means responsive to the user channel identification signal for retrieving the differential decoding enablement data from the memory and configuring the differential decoding means in accordance with said retrieved enablement data.

8. A decoding system according to claim 7, further comprising means for changing said differential decoding indication data stored in the memory.

9. A decoding system for decoding a digital data stream that has been convolutionally encoded in accordance with selected polynomial codes, comprising means for processing said encoded data stream in accordance with said selected polynomial codes to decode said encoded data stream;

a memory for storing data of said selected polynomial codes in accordance with which said data stream was encoded;

means responsive to a user channel identification signal for retrieving said selected polynomial code data from said memory and configuring said processing means in accordance with said selected polynomial codes;

means for automatically synchronizing the decoding of said encoded data by the processing means;

wherein the memory further stores data indicating whether or not the synchronizing means are to be enabled; and means responsive to the user channel identification signal for retrieving the synchronizing means enablement data from the memory and configuring the synchronizing means in accordance with said retrieved enablement data.

10. A decoding system according to claim 9, further comprising means for changing said differential decoding indication stored in the memory.

11. A decoding system for decoding a digital data stream that has been convolutionally encoded in accordance with selected polynomial codes, comprising means for processing said encoded data stream in accordance with said selected polynomial codes to decode said encoded data stream;

a memory for storing data of said selected polynomial codes in accordance with which said data stream was encoded; and means responsive to a user channel identification signal for retrieving said selected polynomial code data from said memory and configuring said processing means in accordance with said selected polynomial codes;

wherein the encoded data stream includes I and J components, wherein the J component includes a polarity sign and wherein the decoding system further comprises means for reversing the sign for the J component prior to said processing of the encoded data stream by the processing means;

wherein the memory further stores data indicating whether or not the sign of the J component should be reversed; and means responsive to the user channel identification signal for retrieving the sign reversal data from the memory and configuring the sign reversal means in accordance with said retrieved sign reversal data.

12. A decoding system according to claim 11, further comprising means for changing said differential decoding indication stored in the memory.

* * * * *